(12) United States Patent
Koo

(10) Patent No.: US 8,368,074 B2
(45) Date of Patent: Feb. 5, 2013

(54) DISPLAY SUBSTRATE

(75) Inventor: Bon-Yong Koo, Asan-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 216 days.

(21) Appl. No.: 12/821,317

(22) Filed: Jun. 23, 2010

(65) Prior Publication Data

US 2011/0186844 A1    Aug. 4, 2011

(30) Foreign Application Priority Data

Feb. 1, 2010    (KR) .......................... 10-2010-008920

(51) Int. Cl.
    H01L 29/04      (2006.01)
    H01L 31/20      (2006.01)
    H01L 31/036     (2006.01)
    H01L 31/0376    (2006.01)

(52) U.S. Cl. ............................. 257/59; 257/232; 349/43

(58) Field of Classification Search .................... 257/59, 257/232; 349/43, 116
See application file for complete search history.

(56) References Cited

U.S. PATENT DOCUMENTS

| | | | | |
|---|---|---|---|---|
| 7,929,085 B2 * | 4/2011 | Park et al. | ..................... | 349/116 |
| RE42,879 E * | 11/2011 | Fujii et al. | ..................... | 349/149 |
| 2010/0079691 A1 * | 4/2010 | Yoshii | ............................. | 349/39 |

* cited by examiner

*Primary Examiner* — Phuc Dang
(74) *Attorney, Agent, or Firm* — F. Chau & Associates, LLC

(57) ABSTRACT

A display substrate includes a substrate, a pixel electrode and a dummy pattern part. The substrate includes a display area and a peripheral area surrounding the display area. The pixel electrode is disposed in the display area and electrically connected to gate and data lines. The dummy pattern part is disposed in the peripheral area and includes a plurality of first dummy electrodes connected to each other in a network form through connection electrodes and a plurality of second dummy electrodes respectively disposed over the first dummy electrodes.

7 Claims, 14 Drawing Sheets

DISPLAY SUBSTRATE

CROSS-REFERENCE TO RELATED APPLICATION

This application claims priority under 35 U.S.C. §119 to Korean Patent Application No. 2010-8920, filed on Feb. 1, 2010 in the Korean Intellectual Property Office (KIPO), the contents of which are herein incorporated by reference in their entirety.

BACKGROUND

1. Technical Field

Exemplary embodiments of the present invention relate to a display substrate and a method of manufacturing the display substrate, and more particularly, to a display substrate capable of preventing defects induced by static electricity and a method of manufacturing the display substrate.

2. Discussion of the Related Art

Generally, a liquid crystal display (LCD) includes a thin-film transistor substrate, a counter substrate, and a liquid crystal layer disposed between the thin-film transistor substrate and the counter substrate. The thin-film transistor substrate includes a plurality of gate lines and a plurality of data lines crossing the gate lines, a plurality of switching elements connected to the gate lines and the data lines, and a plurality of pixel electrodes connected to the switching elements. Each of the switching elements includes a gate electrode extending from the gate line, a channel overlapping the gate electrode, a source electrode extending from the data line and electrically connected to the channel, and a drain electrode spaced apart from the source electrode and electrically connected to the channel.

The gate lines, the data lines, the switching elements, and the pixel electrodes formed on the thin-film transistor substrate are patterned through a photolithography process using masks. Recently, a process for reducing the number of the masks in manufacturing the display substrate has been developed, so that a manufacturing cost and a process time for manufacturing the display substrate may be reduced.

SUMMARY

Exemplary embodiments of the present invention provide a display substrate capable of preventing defects induced by static electricity and a method of manufacturing the display substrate.

According to an embodiment of the present invention, a display substrate includes a substrate, a pixel electrode, and a dummy pattern part. The substrate includes a display area and a peripheral area surrounding the display area. The pixel electrode is disposed in the display area and electrically connected to a gate line and a data line. The dummy pattern part is disposed in the peripheral area and includes a plurality of first dummy electrodes connected to each other in a network form through connection electrodes and a plurality of second dummy electrodes respectively disposed over the first dummy electrodes.

According to an embodiment of the present invention, there is provided a method of manufacturing a display apparatus. In the method, a gate line and a gate electrode connected to the gate line in the display area of a substrate, and a plurality of first dummy electrodes connected to each other in a network form through connection electrodes in a peripheral area surrounding the display area are formed on the substrate. A data line crossing the gate line, a source electrode connected to the data line, a drain electrode spaced apart from the source electrode, and a plurality of first electrode patterns respectively overlapping the first dummy electrodes are formed. A pixel electrode contacting the drain electrode and a plurality of second electrode patterns respectively contacting the first electrode patterns are formed on the substrate.

According to a display substrate and a method of manufacturing the display substrate, the dummy pattern part including the first dummy electrodes connected to each other in the network form, the dummy active patterns formed on the first dummy electrodes and the second dummy electrodes formed on the dummy active patterns, is formed in a peripheral area so that the static electricity flowing into the dummy pattern part during the manufacturing process dissipates. Thus, electronic elements in the display substrate may be prevented from being damaged by the static electricity.

BRIEF DESCRIPTION OF THE DRAWINGS

The embodiments of the present invention will become more apparent by describing in detailed exemplary embodiments thereof with reference to the accompanying drawings, in which.

DETAILED DESCRIPTION OF EXEMPLARY EMBODIMENTS

Figure 1:
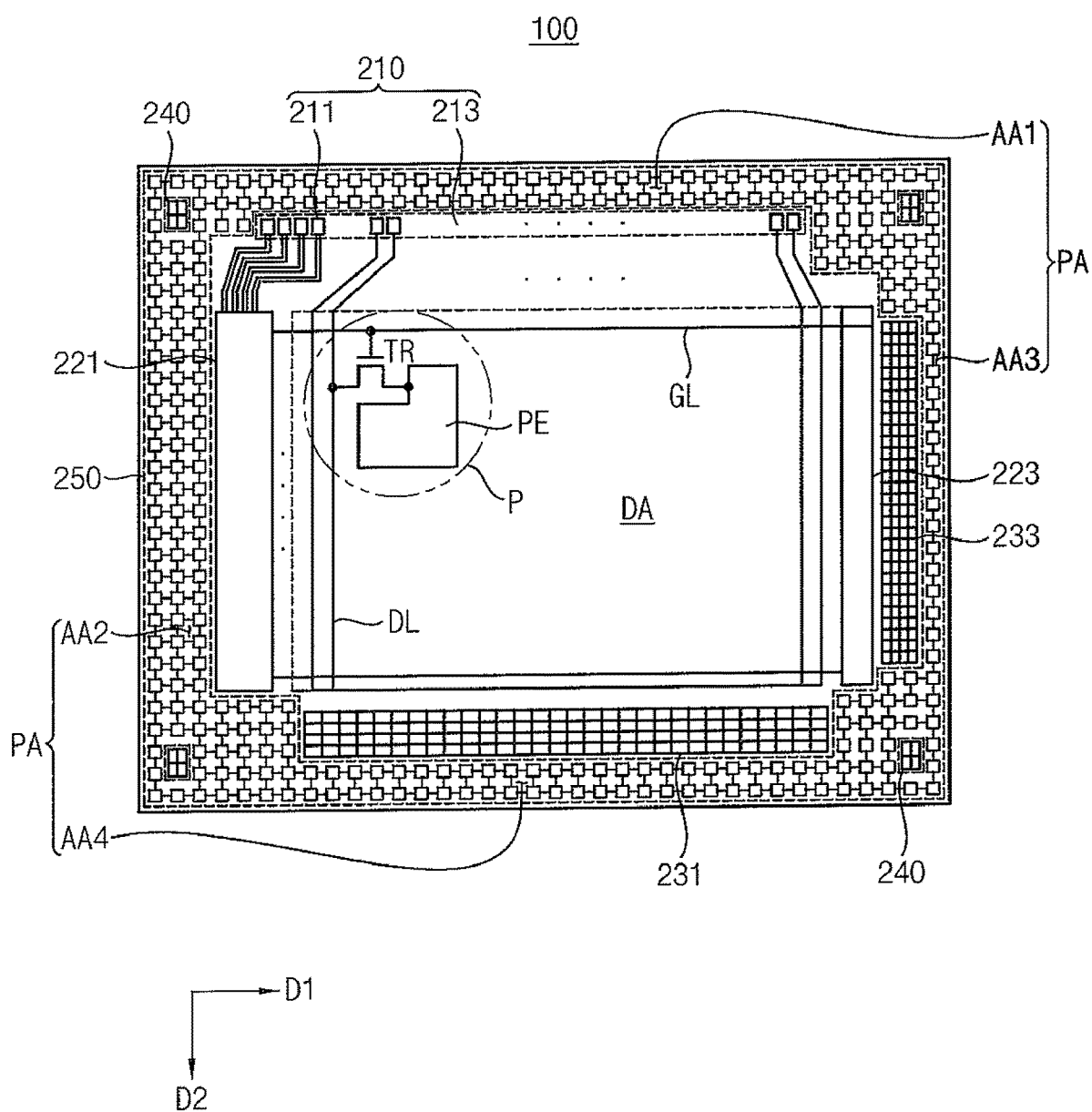
FIG. 1 is a plan view illustrating a display substrate according to an exemplary embodiment of the present invention.

Embodiments of the present invention will be described more fully hereinafter with reference to the accompanying drawings, in which exemplary embodiments of the present invention are shown. The present invention may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numerals may refer to like elements throughout the drawings and the specification.

FIG. 1 is a plan view illustrating a display substrate according to an exemplary embodiment of the present invention.

Referring to FIG. 1, the display substrate 100 includes a display area DA displaying an image and a peripheral area PA surrounding the display area DA.

A plurality of gate lines GL, a plurality of data lines DL, and a plurality of pixels are disposed in the display area DA. The pixels are connected to the gate lines GL and the data lines DL. The gate lines GL are extended in a first direction D1 and are arranged in a second direction D2 substantially perpendicular to the first direction D1. The data lines DL are extended in the second direction D2 and are arranged in the first direction D1. Each pixel P includes a pixel transistor TR and a pixel electrode PE. The pixel transistor TR is electrically connected to a data line DL and a gate line GL, and the pixel electrode PE is electrically connected to the pixel transistor TR.

A signal pad part 210, a first gate circuit part 221, a second gate circuit part 223, a first cell-gap compensation part 231, a second cell-gap compensation part 233, an alignment mark 240, and a dummy pattern part 250 are disposed in the peripheral area PA.

The signal pad part 210 is disposed in a first area AA1 of the peripheral area PA adjacent to first ends of the data lines DL. The signal pad part 210 includes a plurality of gate pads 211 receiving a plurality of gate control signals that are provided to the first gate circuit part 221 and a plurality of data pads 213 receiving a plurality of data signals that are provided to the data lines DL.

The first gate circuit part 221 is disposed in a second area AA2 of the peripheral area PA adjacent to first ends of the gate lines GL. The first gate circuit part 221 includes a plurality of circuit transistors that are formed in the second area AA2 by the same manufacturing process as that of the pixel transistors TR in the display area DA. The first gate circuit part 221 includes a plurality of terminals that output a plurality of gate signals and are connected to the first ends of the gate lines GL.

The second gate circuit part 223 is disposed in a third area AA3 of the peripheral area PA adjacent to second ends of the gate lines GL. The second gate circuit part 223 includes a plurality of circuit transistors that are formed in the third area AA3 by the same manufacturing process as that of the pixel transistors TR in the display area DA. The second gate circuit part 223 includes a plurality of terminals that output a plurality of gate signals and are connected to the second ends of the gate lines GL.

The first cell-gap compensation part 231 is disposed in a fourth area AA4 of the peripheral area PA adjacent to second ends of the data lines DL. The first cell-gap compensation part 231 includes a plurality of metal patterns and compensates for a cell-gap difference between the second area AA2 having the first gate circuit part 221 and the fourth area AA4.

The second cell-gap compensation part 233 is disposed in the third area AA3 of the peripheral area PA adjacent to the second gate circuit part 223. The second cell-gap compensation part 233 includes a plurality of source metal patterns and compensates for a cell-gap difference between the second area AA2 having the first gate circuit part 221 and the third area AA3.

The alignment mark 240 is used for aligning the display substrate 100 with a polarizing film and the display substrate 100 with a flexible printed circuit board (FPCB).

The dummy pattern part 250 is disposed in the peripheral area PA, and includes a plurality of first dummy electrodes connected to each other in a network form and a plurality of second dummy electrodes respectively overlapping the first dummy electrodes. The dummy pattern part 250 includes a plurality of capacitors defined by the first and second dummy electrodes. The capacitors reduce static electricity flowing into the display substrate 100. The dummy pattern part 250 prevents a plurality of electronic elements in the display substrate 100 from being damaged by the static electricity.

Figure 2:
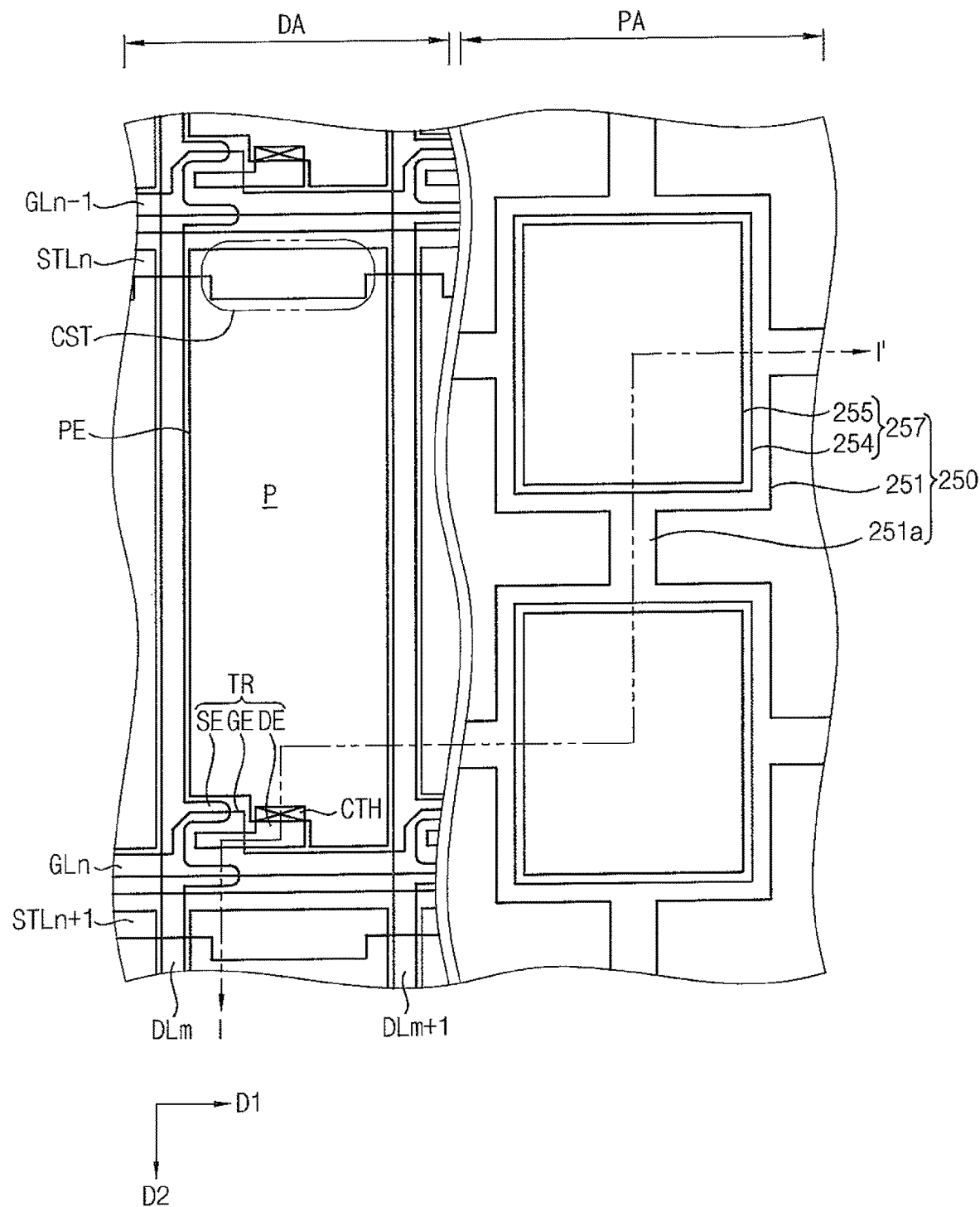
FIG. 2 is an enlarged view illustrating part of the display substrate of FIG. 1.
Figure 3:
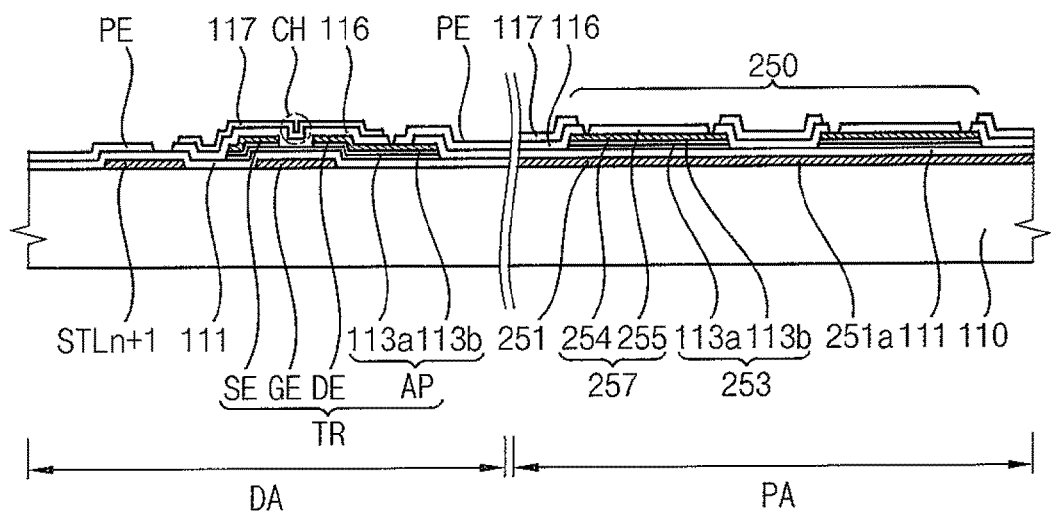
FIG. 3 is a cross-sectional view taken along a line I-I' in FIG. 2.

FIG. 2 is an enlarged view illustrating part of the display substrate of FIG. 1. FIG. 3 is a cross-sectional view taken along a line I-I' in FIG. 2.

Referring to FIGS. 2 and 3, the display substrate 100 includes a substrate 110 including the display area DA and the peripheral area PA.

A plurality of gate lines GLn−1 and GLn, a plurality of storage lines STLn and STLn+1, a plurality of data lines DLm and DLm+1, and a pixel P are disposed in the display area DA of the substrate 110. The gate lines GLn−1 and GLn and the storage lines STLn and STLn+1 are extended in the first direction D1 and arranged in the second direction D2. Herein, n and m are natural numbers. The data lines DLm and DLm+1 are extended in the second direction D2 and arranged in the first direction D1.

The pixel P includes a pixel transistor TR, a pixel electrode PE, and a storage capacitor CST.

The pixel transistor TR includes a gate electrode GE connected to an n-th gate line GL, a source electrode SE connected to an m-th data line DLm, and a drain electrode DE spaced apart from the source electrode SE and connected to the pixel electrode PE. The pixel transistor TR further includes an active pattern AP that is disposed between the gate electrode GE and the source electrode SE and between the gate electrode GE and the drain electrode DE. For example, the active pattern AP includes a semiconductor layer 113a made of amorphous silicon (a-Si) and an ohmic contact layer 113b made of amorphous silicon highly doped with n-type ions (n+a-Si). The semiconductor layer 113a and the ohmic contact layer 113b are stacked on each other. A channel CH is formed between the source electrode SE and the drain electrode DE and exposes the semiconductor layer 113a.

The pixel electrode PE is disposed in a pixel area defining the pixel P, and includes a transparent conductive material. For example, the transparent conductive material includes indium tin oxide (ITO), indium zinc oxide (IZO), or amorphous indium tin oxide (a-ITO). The pixel electrode PE overlaps an end of the drain electrode DE and is electrically connected to the end of the drain electrode DE through a contact hole CTH. The pixel electrode PE overlaps an n-th storage line STLn.

The storage capacitor CST may be defined by the n-th storage line STLn and the pixel electrode PE.

The dummy pattern part 250 is disposed in the peripheral area PA of the substrate 110. The dummy pattern part 250 includes a plurality of first dummy electrodes 251, a plurality of dummy active patterns 253, and a plurality of second dummy electrodes 257.

The first dummy electrodes 251 are connected to each other through connection electrodes 251a in a network form. Each of the first dummy electrodes 251 may have a quadrangular shape a side of which may have a length between about 100 μm and about 200 μm. The first dummy electrode 251 may be formed in the same gate metal layer as the gate electrode GE.

The dummy active patterns 253 are disposed on the first dummy electrodes 251, respectively. Each of the dummy active patterns 253 includes the semiconductor layer 113a and the ohmic contact layer 113b.

The second dummy electrodes 257 are spaced apart from each other, and each of the second dummy electrodes 257 includes a first electrode pattern 254 directly on a corresponding dummy active pattern 253 and a second electrode pattern 255 directly on the first electrode pattern 254. The first electrode pattern 254 of the second dummy electrode 257 may be formed in the same source metal layer as the source electrode SE, and the second electrode pattern 255 may include the same transparent conductive material as that of the pixel electrode PE.

The display substrate 100 further includes a gate insulating layer 111, a protecting layer 116, and a sacrificing layer 117.

The gate insulating layer 111 is disposed on the substrate 110 over the gate lines GLn−1 and GLn, the gate electrode GE, the storage lines STLn and STLn+1, the first dummy electrodes 251 and the connection electrode 251a that are formed in the gate metal layer.

The protecting layer 116 is disposed on the substrate 110 over the data lines DLm and DLm+1, the source electrode SE and the drain electrode DE that are formed in the source metal layer. The protecting layer 116 of the peripheral area PA is disposed on the gate insulating layer 111 that covers the connection electrode 251a. The sacrificing layer 117 is disposed on the protecting layer 116.

Figure 4A:
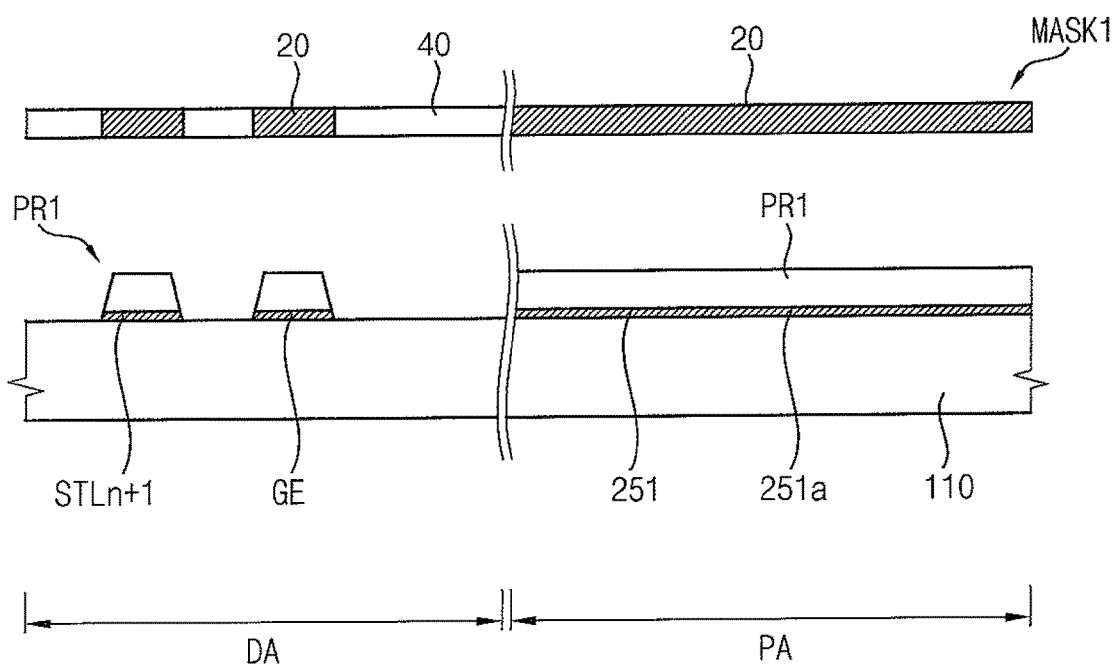
FIG. 4A is a cross-sectional view illustrating a method of manufacturing the display substrate of FIG. 2 using a first mask.
Figure 4B:
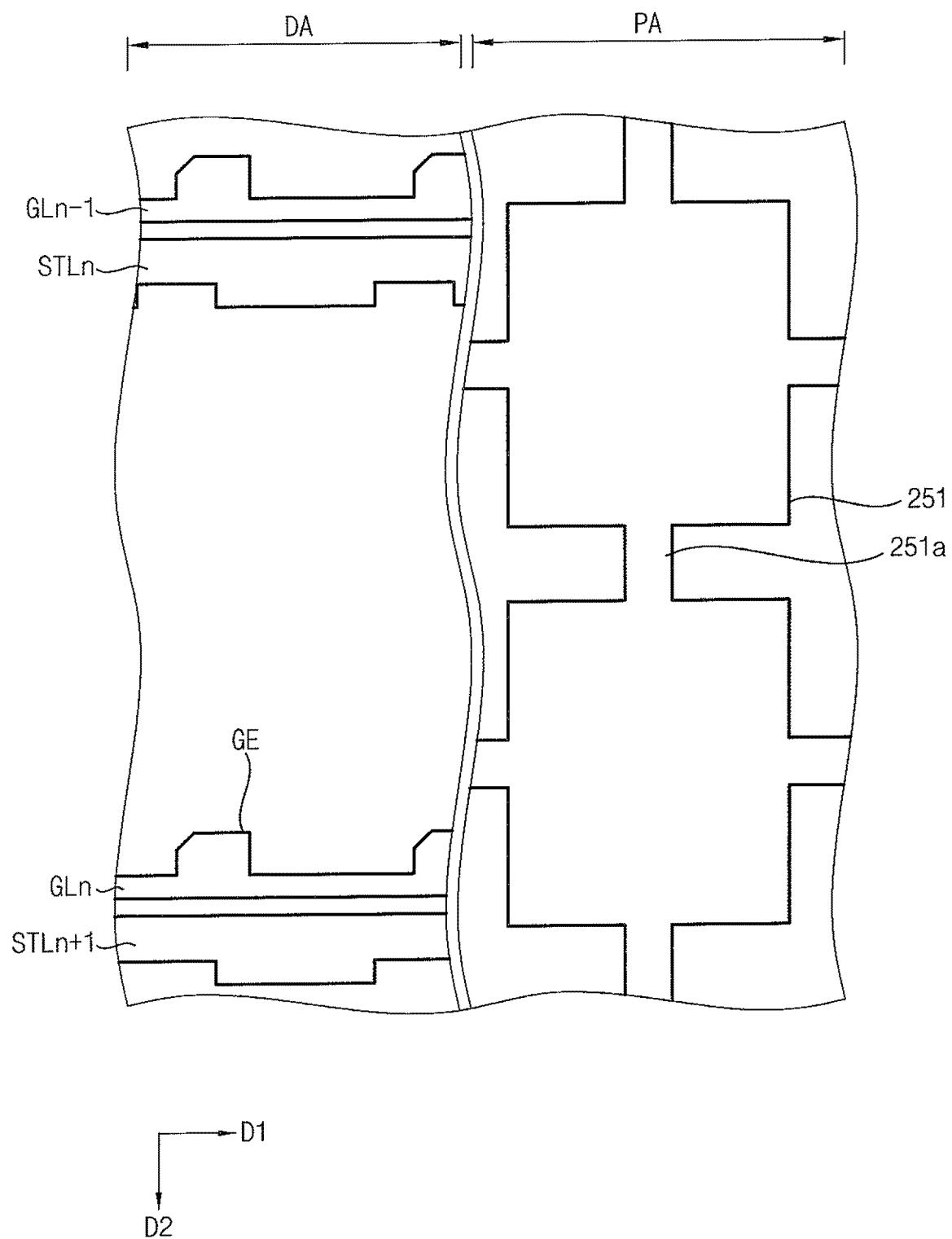
FIG. 4B is a plan view illustrating a method of manufacturing the display substrate of FIG. 2 using the first mask.

FIG. 4A is a cross-sectional view illustrating a method of manufacturing the display substrate of FIG. 2 using the first mask. FIG. 4B is a plan view illustrating a method of manufacturing the display substrate of FIG. 2 using the first mask.

Referring to FIGS. 4A and 4B, the substrate 110 includes a transparent material, and has the display area DA and the peripheral area PA surrounding the display area DA. A gate metal layer (not shown) is formed on the substrate 110 and a first photoresist layer (not shown) is formed on the gate metal layer. For example, the gate metal layer includes a metal, such as chromium (Cr), aluminum (Al), tantalum (Ta), molybdenum (Mo), titanium (Ti), tungsten (W), copper (Cu), silver (Ag), or an alloy thereof. For example, the gate metal layer may be formed in a sputtering process. In addition, the gate metal layer may include at least two layers having physical characteristics different from each other. For example, the first photoresist layer may include a positive photoresist having a portion dissolved by a developing solution when exposed to light.

Then, a first mask MASK1 is arranged over the substrate 110 having the first photoresist layer. The first mask MASK1 includes a blocking portion 20 blocking light and a transmitting portion 40 transmitting light. Then, photolithography for exposing the first photoresist layer to light and developing the exposed first photoresist layer is performed using the first mask MASK1. As a result, a first photoresist pattern PR1 is formed on the gate metal layer.

The gate metal layer is patterned in an etching process using the first photoresist pattern PR1 so that a gate metal pattern is formed on the substrate 110. The gate metal pattern includes the gate lines GLn−1 and GLn, the gate electrode GE, and the storage lines STLn and STLn+1 in the display area DA of the substrate 110. The gate metal pattern further includes in the peripheral area PA of the substrate 110 the first dummy electrodes 251 and the connection electrodes 251a that connect the first dummy electrodes 251 with each other in a network form.

The etching process, for example, may be a wet etching process. After the wet etching process, an ashing process is performed for removing the first photoresist pattern PR1 remaining on the gate metal pattern. For example, the ashing process includes an oxygen plasma process. The ashing process is performed after every etching process using the photoresist pattern.

The first photoresist layer may include a negative photoresist. In this case, the positions of the blocking portion 40 and the transmitting portion 20 in the first mask MASK1 are reversed.

Figure 5A:
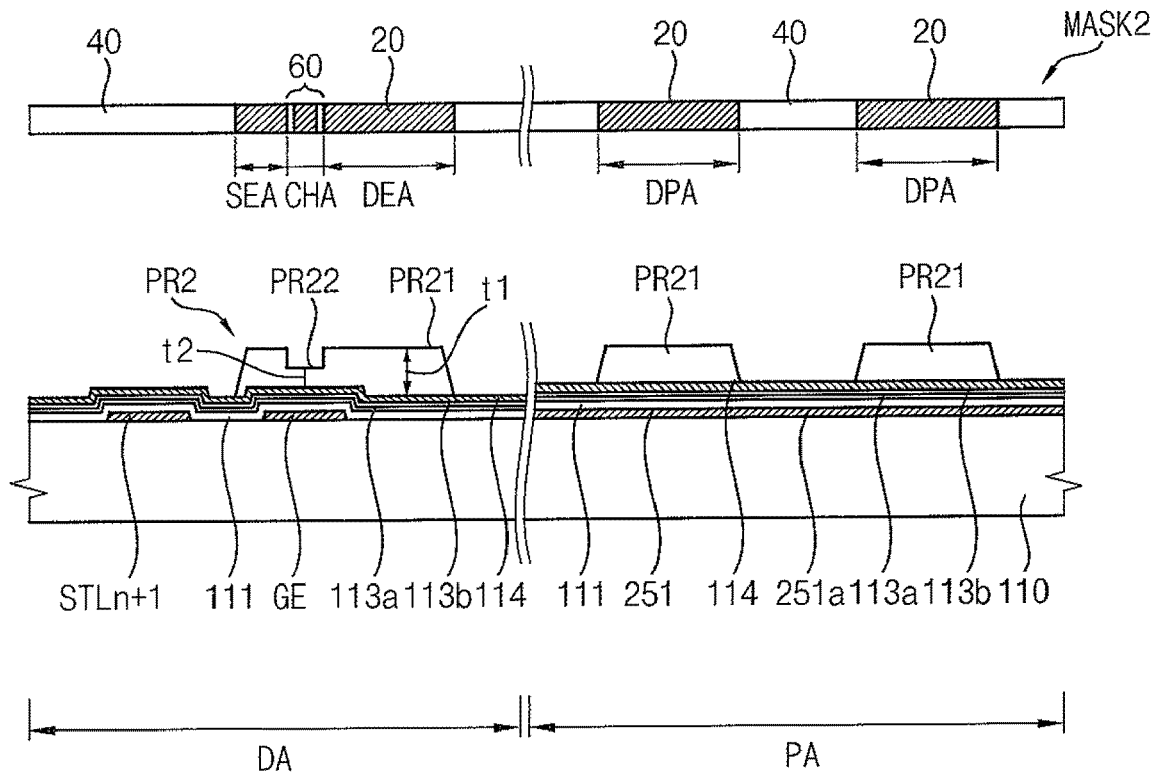
FIGS. 5A, 5B and 5D are cross-sectional views illustrating a method of manufacturing the display substrate of FIG. 2 using a second mask.
Figure 5B:
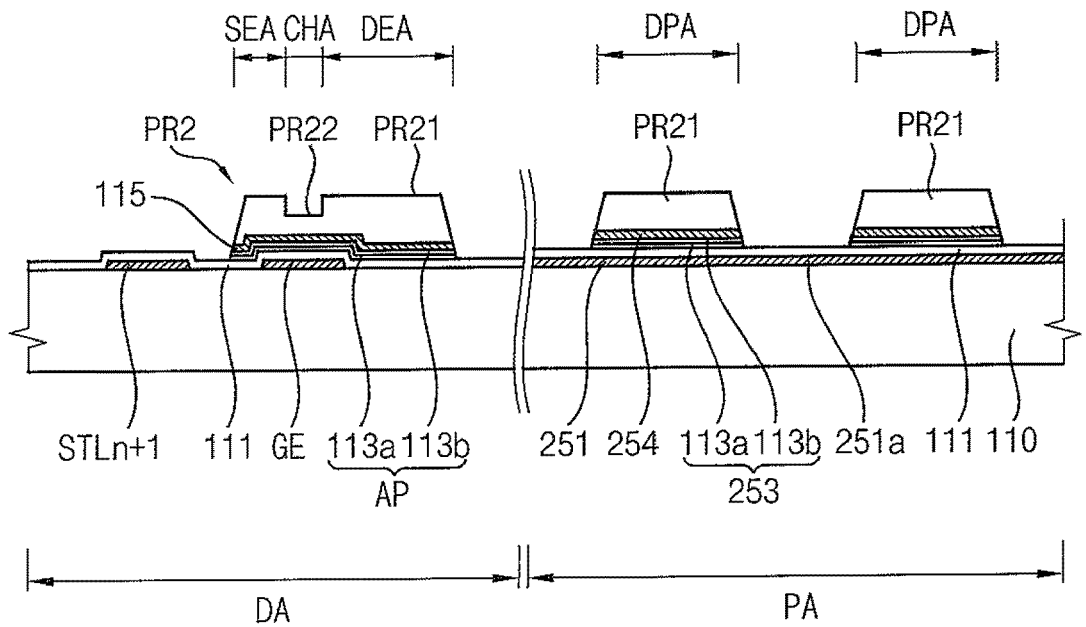
Figure 5C:
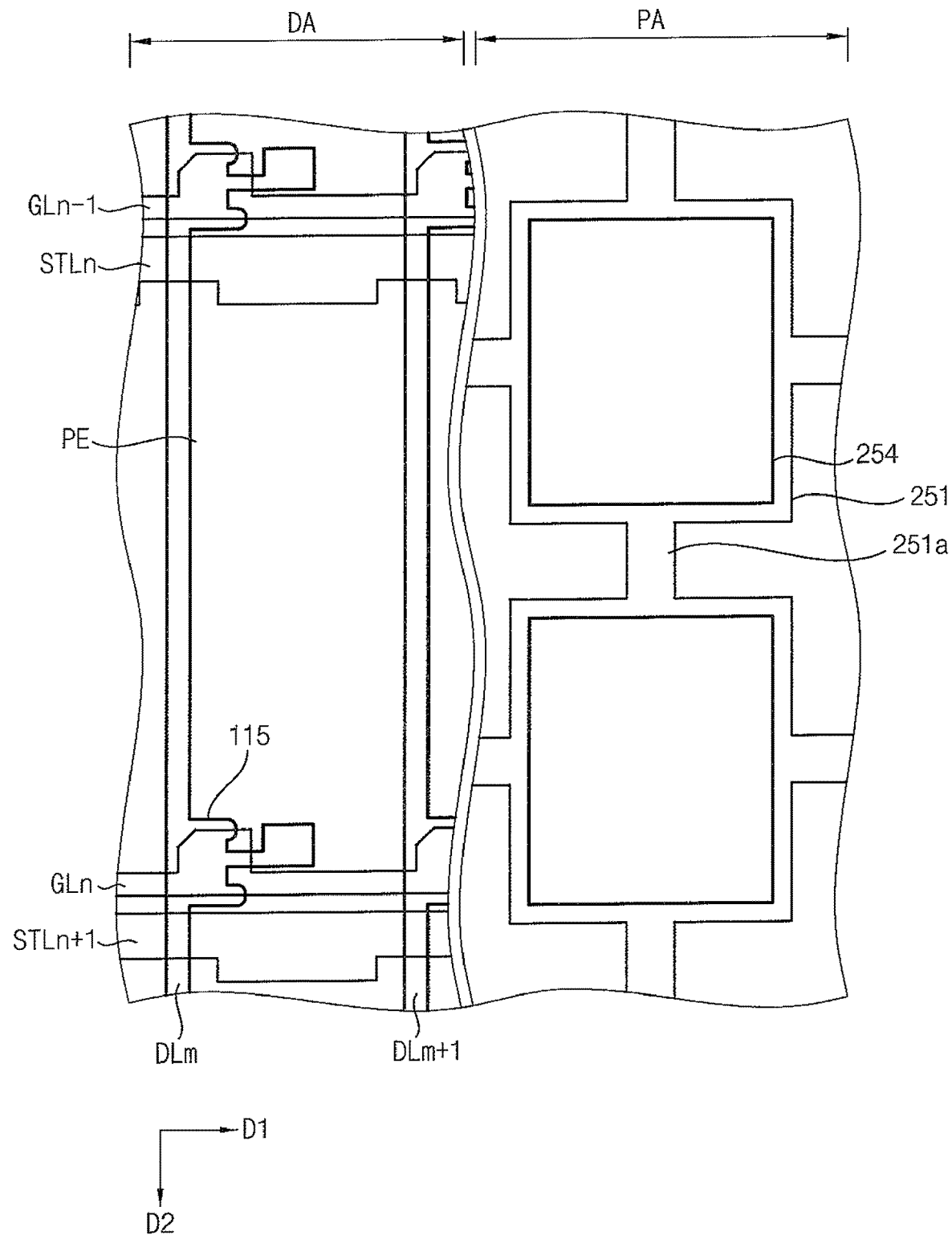
FIGS. 5C and 5E are plan views illustrating a method of manufacturing the display substrate of FIG. 2 using the second mask.
Figure 5D:
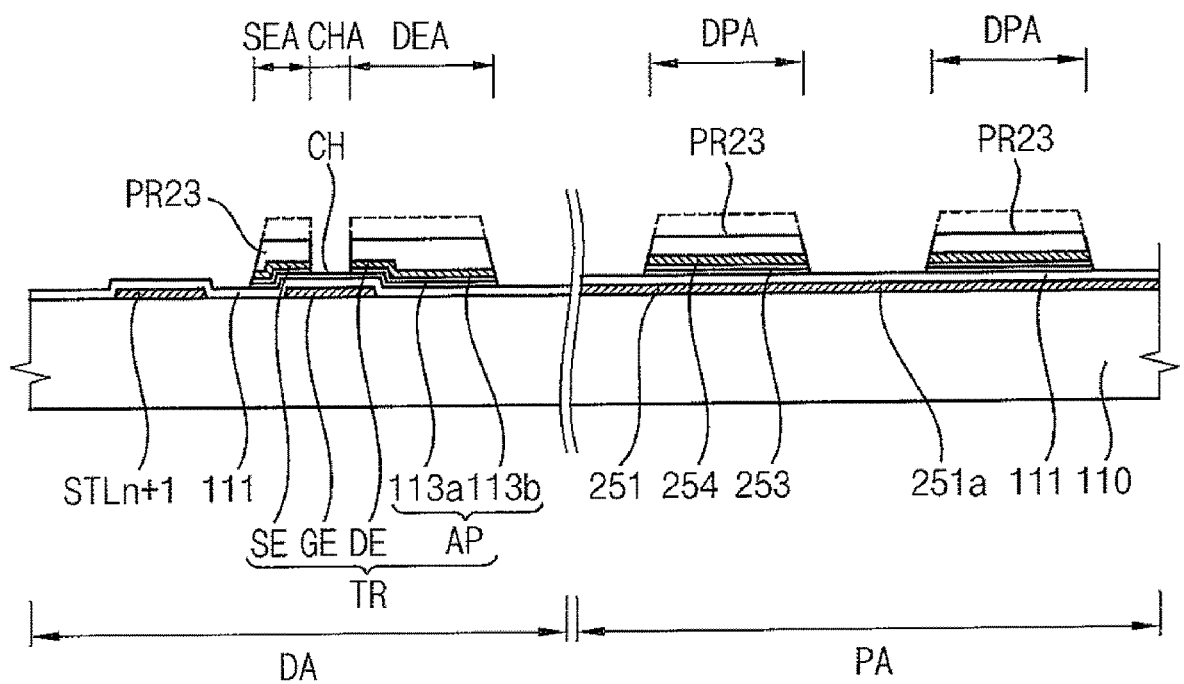
Figure 5E:
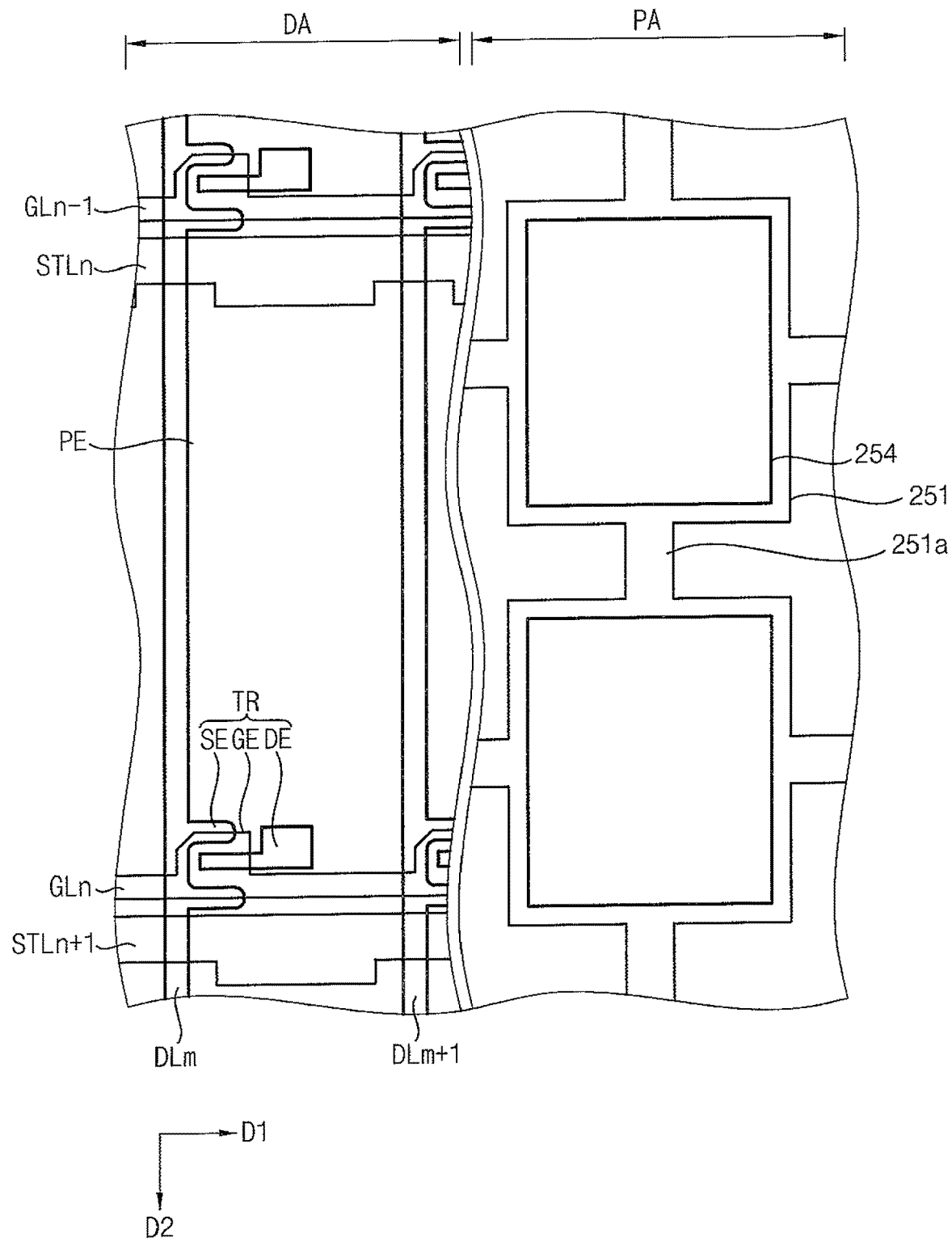

FIGS. 5A, 5B and 5D are cross-sectional views illustrating a method of manufacturing the display substrate of FIG. 2 using a second mask. FIGS. 5C and 5E are plan views illustrating a method of manufacturing the display substrate of FIG. 2 using the second mask.

Referring to FIG. 5A, the gate insulating layer 111 is formed on the substrate 110 having a gate metal pattern. The gate insulating layer 111 includes silicon nitride (SiNx) or silicon oxide (SiOx). For example, the gate insulating layer 111 may be formed by a plasma enhanced chemical vapor deposition ("PECVD") process. In addition, the gate insulating layer 111 may have two sub layers that are formed from different materials and formation processes.

The active layers 113a and 113b are formed on the substrate 110 having the gate insulating layer 111. The active layers 113a and 113b include the semiconductor layer 113a made of amorphous silicon (a-Si) and the ohmic contact layer 113b made of n+ amorphous silicon (n+a-Si). For example, the semiconductor layer 113a and the ohmic contact layer 113b may be formed by a PECVD process.

The source metal layer 114 is formed on the substrate 110 having the ohmic contact layer 113b. The source metal layer 114 includes a metal, such as chromium (Cr), aluminum (Al), tantalum (Ta), molybdenum (Mo), titanium (Ti), tungsten (W), copper (Cu), silver (Ag), or an alloy thereof. For example, the gate metal layer is formed by a sputtering process. In addition, the gate metal layer may include at least two sub layers having different physical characteristics from each other.

A second photoresist layer (not shown) is formed on the substrate 110 having the source metal layer 114. For example, the second photoresist layer may include a positive photoresist layer having a portion dissolved by a developing solution when exposed to light.

Then, the second mask MASK2 is arranged over the substrate 110 having the second photoresist layer. The second mask MASK2 includes a blocking portion 20, a transmitting portion 40, and a diffraction portion 60. The diffraction portion 60 includes a slit pattern diffracting light. The amount of light passing through the diffraction portion 60 is less than that of light passing through the transmitting portion 40. Then, photolithography for exposing the second photoresist layer and developing the exposed second photoresist layer is performed using the second mask MASK2, thus forming a second photoresist pattern PR2 on the gate insulating layer 111.

The second photoresist pattern PR2 includes a first photo pattern PR21 formed by the blocking portion 20 and a second photo pattern PR22 formed by the diffraction portion 60. The first photo pattern PR21 has a first thickness t1 and the second photo pattern PR22 has a second thickness t2 smaller than the first thickness t1. The first photo pattern PR21 is formed on the source metal layer 114 in a source electrode area SEA, a drain electrode area DEA, and data line areas of the display area DA, and is formed on the source metal layer 114 in a dummy pattern area DPA of the peripheral area PA. The source electrode SE is formed in the source electrode area SEA, the drain electrode DE is formed in the drain electrode area DEA, and the data lines DLm and DLm+1 are formed in the data line areas. The second dummy electrodes 257 are formed in the dummy pattern area DPA. The second photo pattern PR22 is formed on the source metal layer 114 in a channel area CHA of the display area DA. The channel CH is formed in the channel area CHA.

Referring to FIGS. 5B and 5C, the source metal layer 114 is etched using the second photoresist pattern PR2 that includes the first and second photo patterns PR21 and 22.

A source metal pattern is formed in the display area DA of the substrate 110. The source metal pattern includes the data lines DLm and DLm+1 and a transistor pattern 115. The transistor pattern 115 connects the source electrode SE with the drain electrode DE. The transistor pattern 115 is connected to the data lines DLm and DLm+1. The source metal pattern including the first electrode patterns 254 is formed in the peripheral area PA of the substrate 110.

Then, the semiconductor layer 113a and the ohmic contact layer 113b are etched using the second photoresist pattern PR2. For example, the semiconductor layer 113a and the ohmic contact layer 113b are etched in a dry etching method. As a result, the active pattern AP having substantially the same shape as that of the source metal pattern is formed under the source metal pattern. For example, in the display area DA, the active pattern AP is formed under the data lines DLm and DLm+1 and the transistor pattern 115. In the peripheral area PA, the dummy active pattern 253 is formed under the first electrode pattern 254.

Referring to FIGS. 5D and 5E, the second photoresist pattern PR2 is partially removed by a predetermined thickness in an ashing process using, for example, oxygen plasma. The removed thickness is smaller than the first thickness t1 and larger than the second thickness t2.

Through the ashing process, the second photo pattern PR22 formed at the channel area CHA is removed and the first photo pattern PR21 is partially removed to be a third photo pattern PR23 having a third thickness t3 in the source electrode area SEA, the drain electrode area DEA, and the data line area (not shown).

Then, the transistor pattern 115 having the preliminary source and drain electrodes connected to each other is etched using the third photo pattern PR23 to form the source electrode SE and the drain electrode DE spaced apart from each other.

The ohmic contact layer 113b exposed between the source electrode SE and the drain electrode DE is etched to form the channel CH exposing the semiconductor layer 113a. Thus, the pixel transistor TR having the gate electrode GE, the source electrode SE, the drain electrode DE, and the active pattern AP is formed in the display area DA of the substrate 110.

Then, the third photo pattern PR23, which remains on the pixel transistor TR and the second electrode pattern 254, is removed through an ashing process using oxygen plasma.

FIGS. 6A, 6C, 6D, 6E and 6F are cross-sectional views illustrating a method of manufacturing the display substrate of FIG. 2 using a third mask. FIG. 6B is a plan view of the third mask used in the method of manufacturing the display substrate of FIG. 2.

Figure 6A:
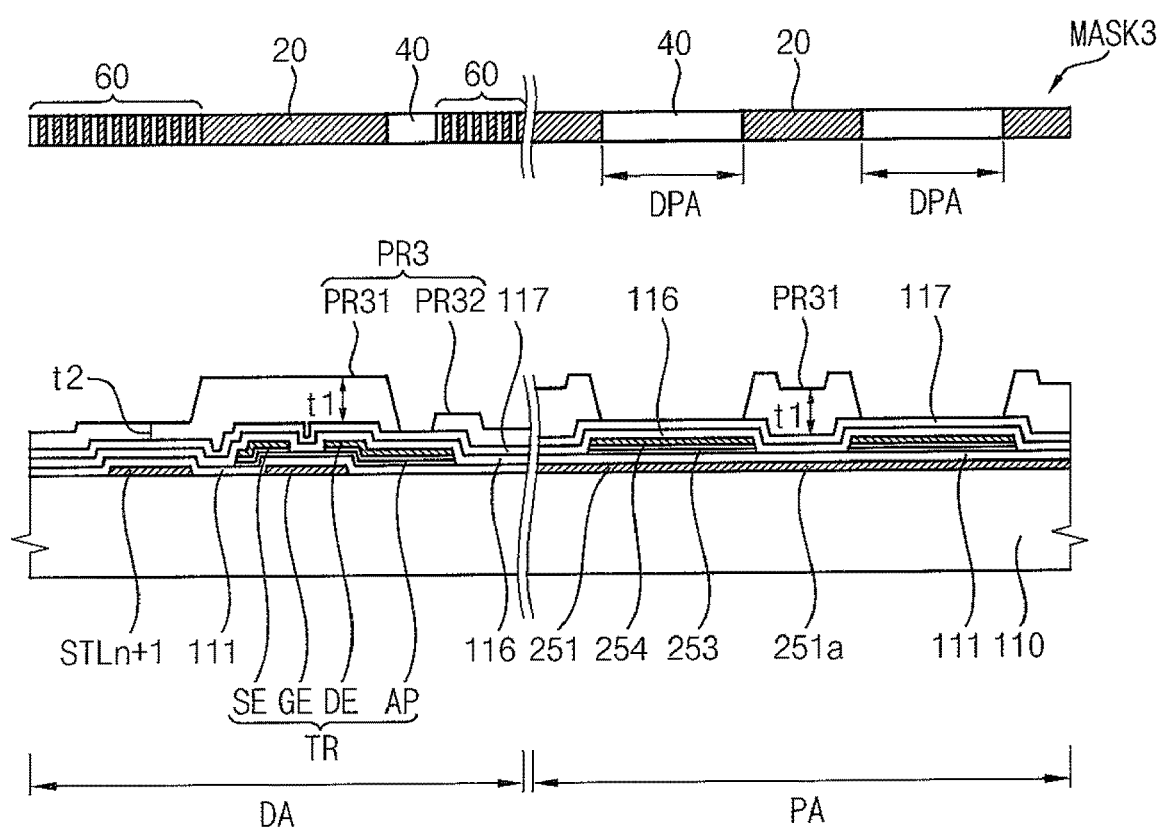
FIGS. 6A, 6C, 6D, 6E and 6F are cross-sectional views illustrating a method of manufacturing the display substrate of FIG. 2 using a third mask.
Figure 6B:
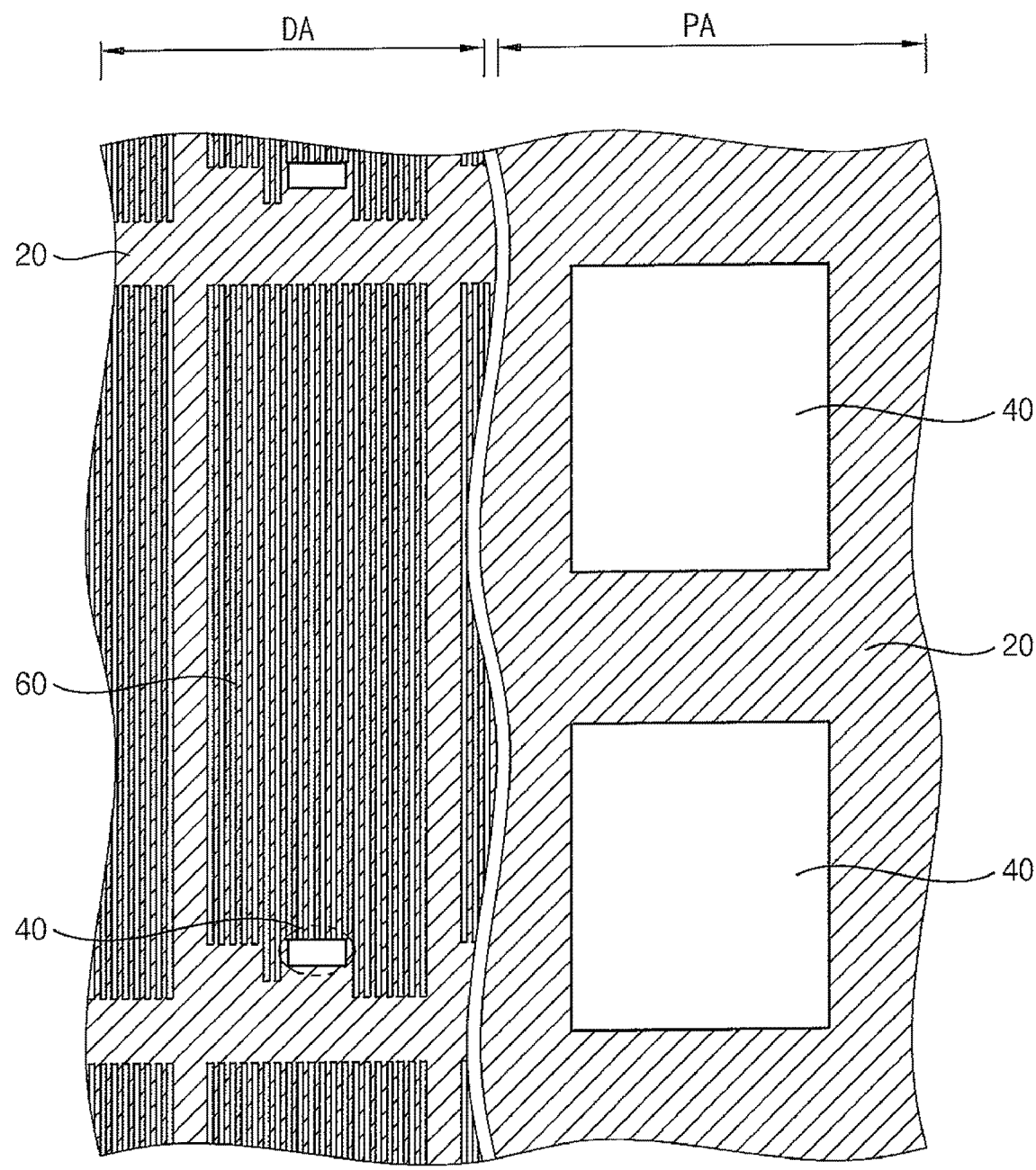
FIG. 6B is a plan view of the third mask used in a method of manufacturing the display substrate of FIG. 2.

Referring to FIGS. 6A and 6B, the protecting layer 116 and the sacrificing layer 117 are sequentially formed on the substrate 110 having the pixel transistor TR. The sacrificing layer 117 is sacrificed for forming an undercut that is used for removing a third photoresist pattern in a subsequent lift-off process.

A third photoresist layer (not shown) is formed on the substrate 110 having the sacrificing layer 117. For example, the third photoresist layer may include a positive photoresist layer dissolved by a developing solution when exposed to light.

Then, the third mask MASK3 is arranged over the substrate 110 having the third photoresist layer. The third mask MASK3 includes a blocking portion 20, a transmitting portion 40, and a diffraction portion 60.

The blocking portion 20 is disposed over the gate lines GLn−1 and GLn, the data lines DLm and DLm+1, and the pixel transistor TR in the display area DA and over the connection electrode 251a in the peripheral area PA.

The transmitting portion 40 is disposed over the end of the drain electrode DE, i.e., a contact part CTH, in the display area DA and over the second dummy electrodes 257, i.e., a dummy pattern area DPA in the peripheral area PA. Although not shown, the transmitting portion 40 of FIG. 1 may be disposed over the gate pads 211 and the data pads 213.

The diffraction portion 60 is disposed over the pixel area having the pixel electrode PE in the display area DA.

The third photoresist layer is patterned through a photolithography process using the third mask MASK3, thus forming a third photoresist pattern PR3 on the substrate 110 having the sacrificing layer 117. The third photoresist pattern PR3 includes a fourth photo pattern PR31 formed by the blocking portion 20 and a fifth photo pattern PR32 formed by the diffraction portion 60. The fourth photo pattern PR31 has a first thickness t1 and the fifth photo pattern PR32 has a second thickness t2 smaller than the first thickness t1.

In the display area DA, the fourth photo pattern PR31 is formed on the sacrificing layer 117 over the gate lines GLn−1 and GLn, the data lines DLm and DLm+1, and the pixel transistor TR. In the peripheral area PA, the fourth photo pattern PR31 is formed on the sacrificing layer 117 over the connection electrode 251a between the neighboring dummy pattern areas DPA. In the display area DA, the fifth photo pattern PR32 is formed on the sacrificing layer 117 that corresponds to be the pixel area.

Figure 6C:
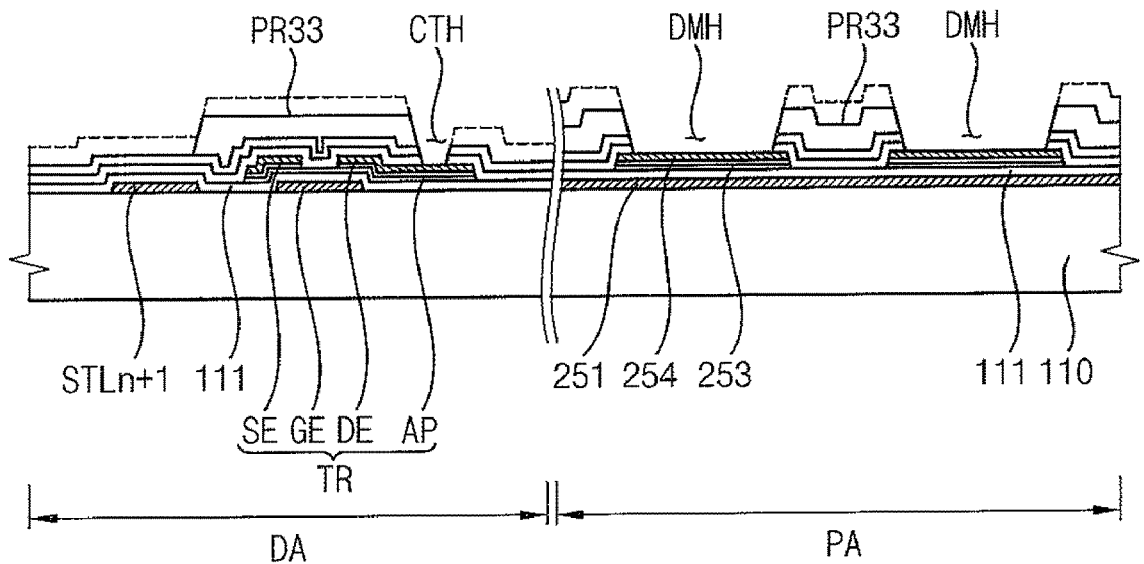

Referring to FIG. 6C, the sacrificing layer 117, the protecting layer 116, and the gate insulating layer 111 are removed by a first dry etching process using the fourth and fifth photo patterns PR31 and PR32.

Through the first dry etching process, the contact hole CTH exposing the end of the drain electrode DE is formed in the display area DA, and the dummy hole DMH is formed in the dummy pattern area DPA of the peripheral area PA. In the display area DA, the sacrificing layer 117 and the protecting layer 116 are removed to form the contact hole CTH. In the peripheral area PA, the sacrificing layer 117, the protecting layer 116, and the gate insulating layer 111 are removed to form the dummy hole DMH.

The fourth and fifth photo patterns PR31 and PR32 are partially removed by a predetermined thickness through an ashing process using, for example, oxygen plasma. The removed thickness is smaller than the first thickness t1 and not less than the second thickness t2.

Through the ashing process, the fifth photo pattern PR32 of the second thickness t2 is removed. The fourth photo pattern 31 is partially removed to be a sixth photo pattern PR33 that is formed on the sacrificing layer 117 over the gate lines GLn−1 and GLn, the data lines DLm and DLm+1, and the pixel transistor TR. In the display area DA, the sixth photo pattern PR33 exposes the protecting layer 116 in the pixel area having the pixel electrode PE. In the peripheral area PA, the sixth photo pattern PR33 remains on the sacrificing layer 117 between the neighboring dummy pattern areas DPA.

Figure 6D:
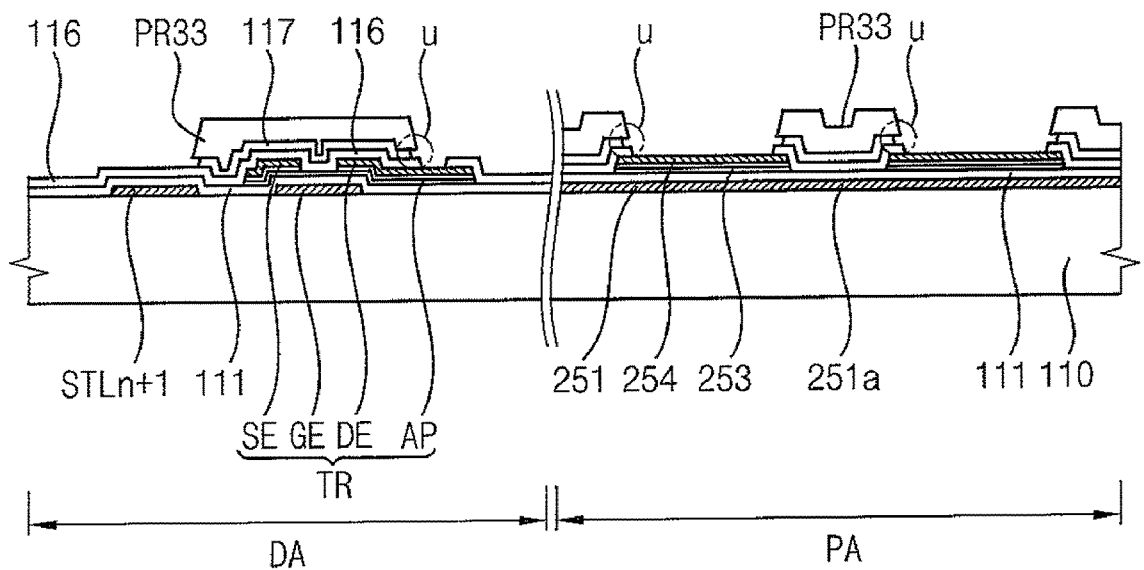

Referring to FIG. 6D, the sacrificing layer 117 is partially removed in a second dry etching process using the sixth photo pattern PR33. The second dry etching process may be an isotropic etching process. The sacrificing layer 117 is isotropically etched so that an edge of the sacrificing layer 117 is internally recessed from an edge of the sixth photo pattern PR33, thus forming an undercut U.

In the display area DA, the sacrificing layer 117 is removed from the pixel area in which the pixel electrode PE is to be formed. The undercut U is formed at the edge of the sacrificing layer 117 under the sixth photo pattern PR33. The sixth photo pattern PR33 is formed on the sacrificing layer 117 over the gate lines GLn−1 and GLn, the data lines DLm and DLm+1, and the pixel transistor TR.

In the peripheral area PA, the undercut U is formed at the edge of the sacrificing layer 117 that covers the connection electrode 251a. According to the present exemplary embodiment, the sacrificing layer 117 is formed on the protecting layer 116 and the undercut U is formed at the sacrificing layer 117. However, the sacrificing layer 117 may be omitted. The undercut U may be formed at the protecting layer 116, and the subsequent lift-off process may be performed using the undercut U formed at the protecting layer 116.

Figure 6E:
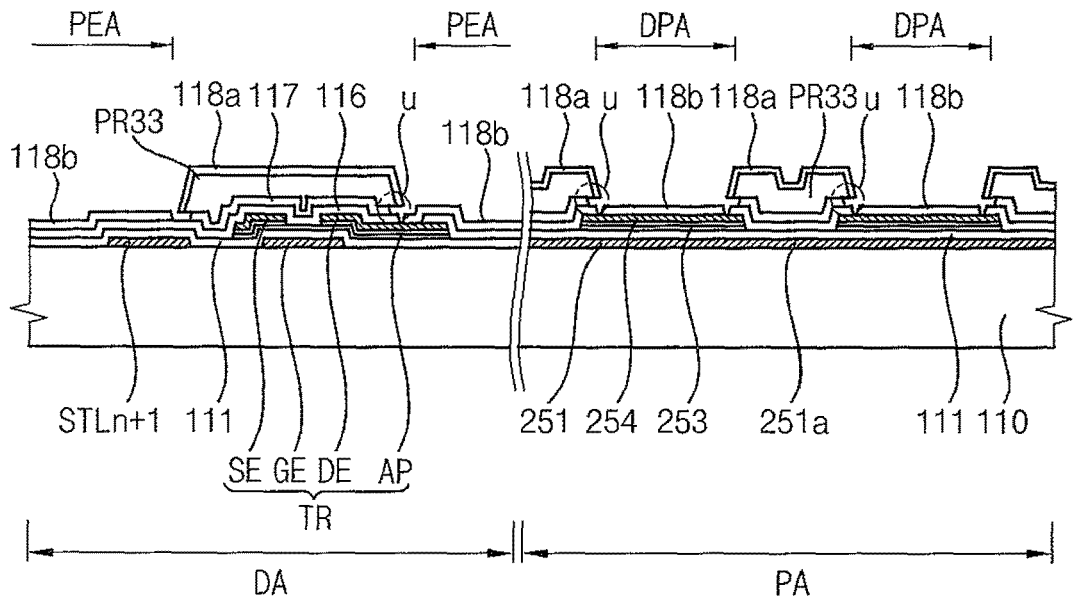

Referring to FIG. 6E, transparent electrode layers 118a and 118b are formed on the substrate 110 having the undercut U and the sixth photo pattern PR33. The transparent electrode layers 118a and 118b may be formed of indium tin oxide (ITO), indium zinc oxide (IZO), or amorphous indium tin oxide (a-ITO) in a sputtering process.

The transparent electrode layers 118a and 118b include a first transparent electrode layer 118a disposed on the sixth photo pattern PR33 and a second transparent electrode layer 118b spaced apart from the first transparent electrode layer 118a. In the display area DA, the second transparent electrode layer 118b is formed at the pixel area PEA having the pixel electrode PE. In the peripheral area PA, the second transparent electrode layer 118b is formed at the dummy pattern area DPA.

Figure 6F:
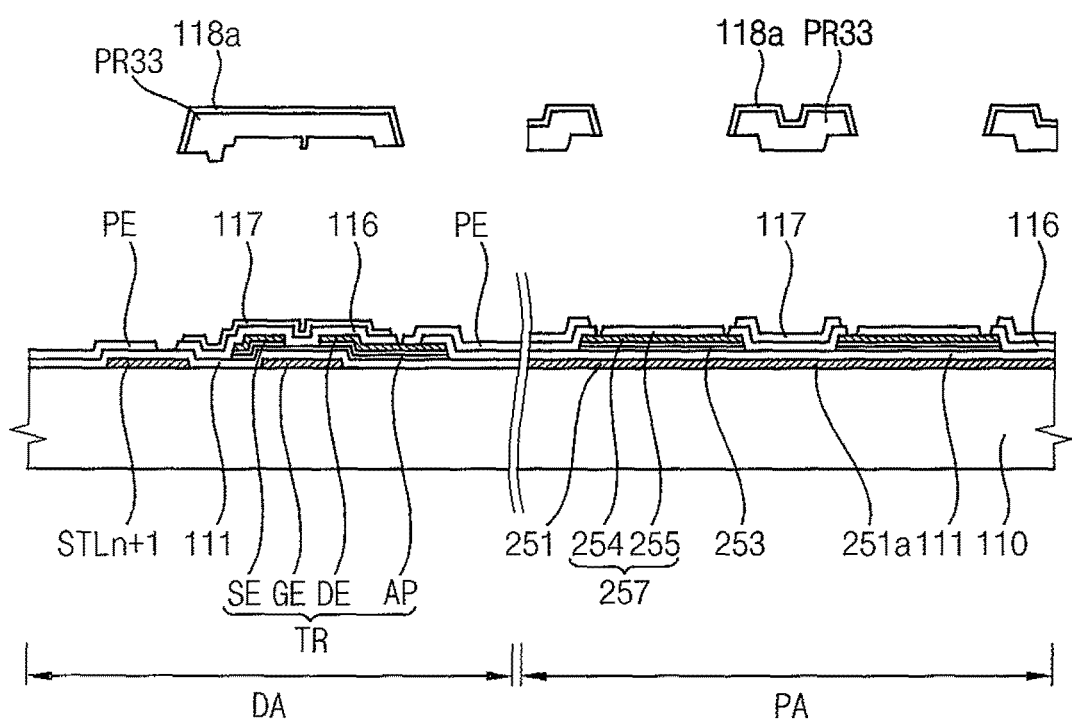

Referring to FIG. 6F, the substrate 110 having the first and second transparent electrode layers 118a and 118b is soaked in a strip solution, e.g., a photoresist stripper. The photoresist stripper infiltrates into the sixth photo pattern PR33 through the undercut U and lifts off the sixth photo pattern PR33 ("lift-off process"). As a result, the sixth photo pattern PR33 is separated from the substrate 110 and the first transparent electrode layer 118a disposed on the sixth photo pattern PR33 is removed from the substrate 110.

As a result, in the display area DA, the pixel electrode PE is connected to the end of the drain electrode DE through the contact hole CTH. In the peripheral area PA, the first electrode pattern 254 is directly connected to the second electrode pattern 255. That is, the second dummy electrode 275 having the first and second electrode patterns 254 and 255 is formed in the peripheral area PA.

FIGS. 7A to 7E are conceptual views illustrating an operation of the dummy pattern part of FIG. 1.

Figure 7A:
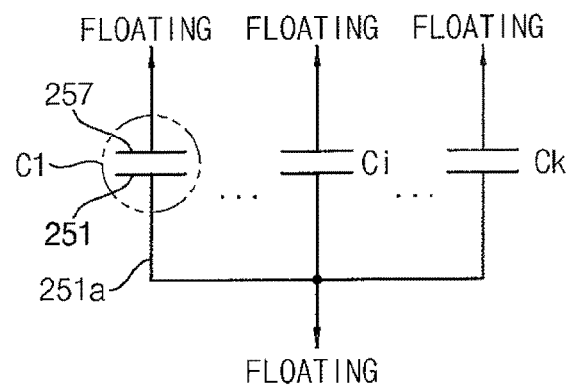
FIGS. 7A to 7E are conceptual views illustrating an operation of the dummy pattern part of FIG. 1.

Referring to FIGS. 1 and 7A, the dummy pattern part 250 includes a plurality of capacitors C1, ..., Ci, ..., and Ck (wherein, k and i are natural numbers). The capacitor Ck includes the first dummy electrode 251, the second dummy electrode 257, and the dummy active pattern 253 between the first and second dummy electrodes 251 and 257. The first dummy electrodes 251 of the capacitors C1, ..., Ci, ..., and Ck are connected to each other through the connection electrode 251a in a network form, and the second dummy electrodes 257 of the capacitors C1, ..., Ci, ..., and Ck are spaced apart from each other.

In an initial state, the first dummy electrodes 251 and the second dummy electrodes 257 are electrically floated.

Figure 7B:
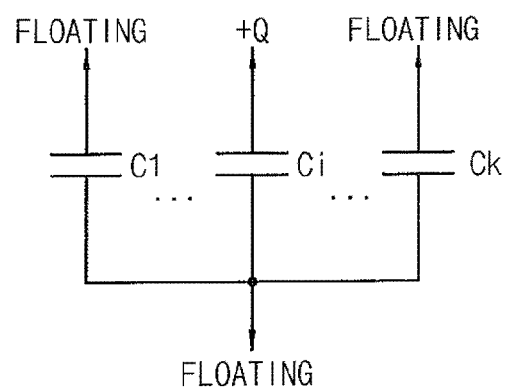

Referring to FIG. 7B, when static electricity flows into the i-th capacitor Ci, the second dummy electrode 257 of the i-th capacitor Ci is charged with a positive electric charge (+Q).

Figure 7C:
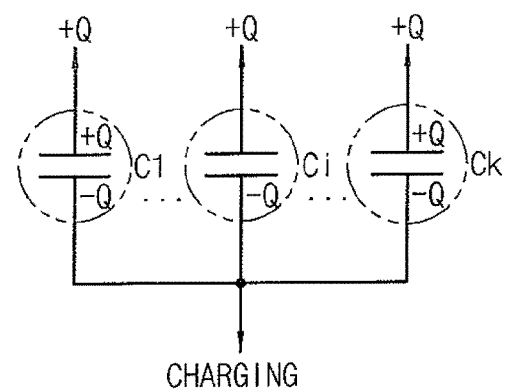

Referring to FIG. 7C, the first dummy electrodes 251 connected through the connection electrodes 251a are charged with a negative electric charge (−Q) by the positive electric charge (+Q) charged to the i-th capacitor Ci, so that the other capacitors C1, ..., Ci−1, Ci+1, ..., and Ck have their corresponding capacitances.

Figure 7D:
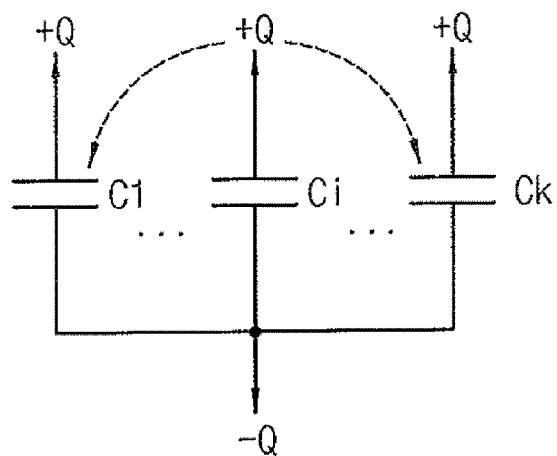

Referring to FIG. 7D, the static electricity flowed into the i-th capacitor Ci in the initial state flows into the other capacitors C1, ..., Ci−1, Ci+1, ..., and Ck.

Figure 7E:
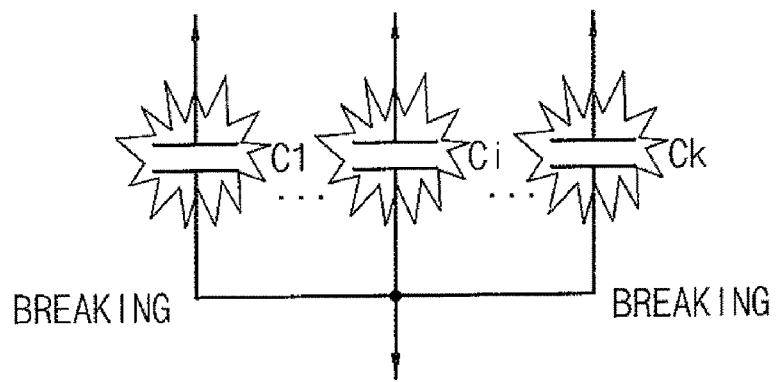

Referring to FIG. 7E, breaking sequentially occurs at the other capacitors C1, ..., Ci−1, Ci+1, ..., and Ck due to release of static electricity energy from the capacitors C1, ..., Ci−1, Ci+1, ..., and Ck, so that the static electricity having flowed into the i-th capacitor Ci dissipates.

As a consequence, electronic elements in the display substrate may be prevented from being damaged by the static electricity.

According to an embodiment of the present invention, the dummy pattern part including the first dummy electrodes connected to each other in the network form, the dummy active patterns formed on the first dummy electrodes, and the second dummy electrodes formed on the dummy active patterns, is formed in peripheral area so that the static electricity flowing into the dummy pattern part during the manufacturing process is dissipated. Thus, electronic elements in the display substrate may be prevented from being damaged by the static electricity.

The foregoing is illustrative of the present invention and is not to be construed as limiting thereof. Although a few exemplary embodiments of the present invention have been described, those skilled in the art will readily appreciate that many modifications are possible in the exemplary embodiments without materially departing from the novel teachings and advantages of the present invention. Accordingly, all such modifications are intended to be included within the scope of the present invention as defined in the claims.

What is claimed is:

1. A display substrate comprising:
    a substrate including a display area and a peripheral area surrounding the display area;
    a pixel electrode disposed in the display area, and electrically connected to gate and data lines; and
    a dummy pattern part disposed in the peripheral area, wherein the dummy pattern part includes,
    a plurality of first dummy electrodes connected to each other through connection electrodes;
    a plurality of second dummy electrodes respectively disposed over the first dummy electrodes; and
    a plurality of dummy active patterns respectively disposed on corresponding first dummy electrodes, and wherein each of the second dummy electrodes includes a first electrode pattern directly on a corresponding one of the dummy active patterns and a second electrode pattern directly on a corresponding one of the first electrode patterns.

2. The display substrate of claim 1, wherein the first and second dummy electrodes are electrically floated.

3. The display substrate of claim 1, further comprising:
    a pixel transistor including a gate electrode connected to the gate line, an active pattern having substantially the same material as the dummy active pattern, a source electrode connected to the data line, and a drain electrode connected to the pixel electrode;
    a protecting layer directly disposed on the pixel transistor; and
    a sacrificing layer directly disposed on the protecting layer.

4. The display substrate of claim 3, wherein the pixel electrode is directly disposed on the protecting layer.

5. The display substrate of claim 3, wherein each of the connection electrodes is connected between two neighboring first dummy electrodes, and wherein the protecting layer and the sacrificing layer are disposed on the connection electrodes.

6. The display substrate of claim 5, wherein the second electrode pattern is connected to the first electrode pattern through a dummy hole formed through the protecting layer and the sacrificing layer.

7. A display substrate comprising:
- a substrate including a display area and a peripheral area surrounding the display area;
- a pixel electrode disposed in the display area, and electrically connected to gate and data lines;
- a dummy pattern part disposed in the peripheral area, and including a plurality of first dummy electrodes connected to each other through connection electrodes and a plurality of second dummy electrodes respectively disposed over the first dummy electrodes;
- a gate circuit part disposed in the peripheral area and providing a gate signal to the gate line;
- a signal pad part disposed in the peripheral area and providing a plurality of signals to the data line and the gate circuit part; and
- an alignment mark disposed in the peripheral area,
- wherein the dummy pattern part is spaced apart from the gate circuit part, the signal pad part, and the alignment mark.

* * * * *